United States Patent
Buchanan

(10) Patent No.: US 10,079,059 B2
(45) Date of Patent: Sep. 18, 2018

(54) MEMRISTOR CELL READ MARGIN ENHANCEMENT

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/324,687

(22) PCT Filed: Jul. 28, 2014

(86) PCT No.: PCT/US2014/048448
§ 371 (c)(1),
(2) Date: Jan. 7, 2017

(87) PCT Pub. No.: WO2016/018220
PCT Pub. Date: Feb. 4, 2016

(65) Prior Publication Data
US 2017/0206955 A1   Jul. 20, 2017

(51) Int. Cl.
*G11C 13/00* (2006.01)
*G11C 11/56* (2006.01)

(52) U.S. Cl.
CPC ........ *G11C 13/004* (2013.01); *G11C 11/5685* (2013.01); *G11C 13/0007* (2013.01); *G11C 13/0069* (2013.01)

(58) Field of Classification Search
CPC .......................... G11C 13/004; G11C 13/0069
USPC ....................................................... 365/148
See application file for complete search history.

(56) References Cited

U.S. PATENT DOCUMENTS

| 7,002,837 | B2 | 2/2006 | Morimoto |
| 7,136,300 | B2 | 11/2006 | Tran et al. |
| 7,409,251 | B2* | 8/2008 | Buhr ................ G06Q 20/341 700/87 |
| 8,064,248 | B2 | 11/2011 | Lung |
| 8,102,695 | B2 | 1/2012 | Ono et al. |
| 8,654,559 | B2 | 2/2014 | Nakano et al. |
| 2002/0136053 | A1* | 9/2002 | Asano ................ G11C 11/16 365/158 |
| 2009/0027811 | A1* | 1/2009 | Guo ................... G11C 11/16 360/324.2 |
| 2010/0208508 | A1 | 8/2010 | Baek et al. |
| 2011/0235409 | A1 | 9/2011 | Kang et al. |
| 2011/0310657 | A1 | 12/2011 | Kim et al. |

(Continued)

OTHER PUBLICATIONS

International Searching Authority, The International Search Report and the Written Opinion, PCT/US2014/048448, Mar. 17, 2015, 9 Pages.

(Continued)

*Primary Examiner* — Hoai V Ho
*Assistant Examiner* — Jay Radke
(74) *Attorney, Agent, or Firm* — Hewlett Packard Enterprise Patent Department

(57) ABSTRACT

Memristor cell read margin enhancement employs programming switched memristor sub-bits of a memristor cell with a first resistive state to increase a relative read margin of the memristor cell. The switched memristor sub-bits of the memristor cell are connected in series. The read margin of the memristor cell is increased relative to a read margin of either of the switched memristor sub-bits.

17 Claims, 6 Drawing Sheets

(56) References Cited

U.S. PATENT DOCUMENTS

2014/0169102 A1   6/2014  Sun et al.
2014/0185361 A1   7/2014  Oh et al.
2015/0200363 A1*  7/2015  Sacchetto .......... G11C 13/0007
                                                                   365/148

OTHER PUBLICATIONS

Zangeneh, M. et al., Design and Optimization of Nonvolatile Multibit 1T1R Resistive RAM, IEEE Transactions on Very Large Scale Integration (VLSI) Systems, Jul. 25, 2013, pp. 1-14.

* cited by examiner

MEMRISTOR CELL READ MARGIN ENHANCEMENT

CROSS-REFERENCE TO RELATED APPLICATIONS

N/A

STATEMENT REGARDING FEDERALLY SPONSORED RESEARCH OR DEVELOPMENT

N/A

BACKGROUND

A memristor or 'memory resistor,' sometimes also referred to as 'resistive random access memory' (RRAM or ReRAM), is a non-linear, passive, two-terminal electrical device having or exhibiting an instantaneous resistance level or state that is substantially a function of bias history. In particular, a bias (e.g., a voltage or a current) applied across terminals of the memristor may be used to set, select or program a resistance of the memristor. Once programmed, the memristor may retain the programmed resistance for a specified period of time after the bias is removed (e.g., until reprogrammed). As such, a memristor is a two-terminal device that may function as a non-volatile memory where the programmed resistance is stored without the application of power to the memristor.

In some examples, the memristor may be switched between a specific pair of resistance levels or 'states' using a programming signal having two different polarities (e.g., a positive voltage and a negative voltage). For example, the memristor may be switched to a first resistance state (e.g., a relatively low resistance level) by a first polarity of the programming signal. The memristor may be switched to a second resistance state (e.g., a relatively high resistance level) by a second polarity of the programming signal, for example. Such switching may be used to implement a binary memory cell or element, for example. In other examples, the memristor may be switched between a plurality of different resistance levels or states to implement a multi-state or multi-level memory cell, for example. In some examples, a plurality of memristors may be arranged in an array (e.g. a crossbar array) to serve as a memory for storing data in a computer system or as programmable logic, according to various applications.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide read margin enhancement of a memristor cell. In particular, according to various examples, a target resistance level or value of a resistive state of the memristor cell is distributed or spread across a plurality of memristor sub-bits within the memristor cell. By spreading the target resistance level across the memristor sub-bits, an increase in an effective separation between resistive states may be achieved both by effectively widening an actual spacing between a resistance level of memristor cell resistive states themselves (e.g., a mean resistance level of the resistive state) and by reducing a variance of the resistance levels of the resistive states. As a result, resistive state spreading across memristor sub-bits may lead to an improvement in the read margin of the memristor cell, according to various examples.

In some examples, the increased read margin may provide improved reliability of the memristor cell, e.g., when the memristor cell is employed as a memory cell in a resistive random access memory (RRAM). In addition, the ability to increase read margin of the memristor cell also may facilitate mitigation of certain effects of memristor cell degradation due to a variety of conditions including, but not limited to, memristor cell 'wear-out' and various manufacturing defects that may result in insufficient native read margin, according to some examples.

Figure 1:
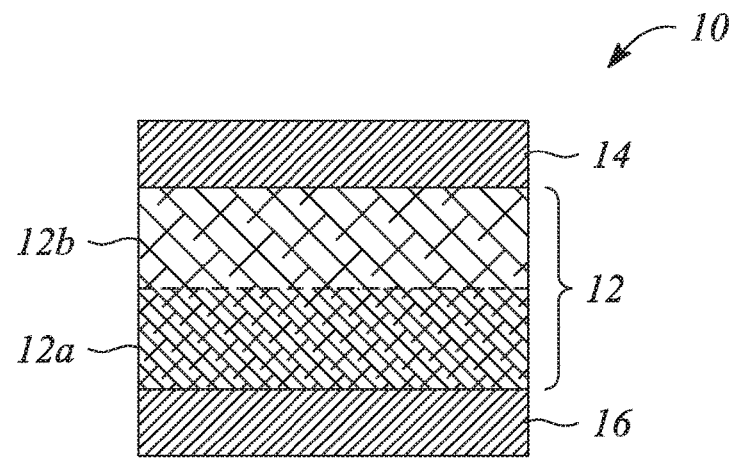
FIG. 1 illustrates a cross sectional view of a memristor, according to an example consistent with the principles described herein.

FIG. 1 illustrates a cross sectional view of a memristor 10, according to an example consistent with the principles described herein. The memristor 10, as illustrated, is a two terminal device including a layer 12 of a memristor switching material, also referred to as a memristor matrix or switching matrix of the memristor 10. By definition herein, the 'memristor switching material' is a material that exhibits a switching phenomenon or characteristic when subjected to a stimulus (e.g., a voltage or a current). The memristor matrix layer 12 is disposed or 'sandwiched' between a first or 'top' electrode 14 and a second or 'bottom' electrode 16. The first and second electrodes 14, 16 facilitate applying a stimulus or 'programming signal' to affect a change in the memristor matrix layer 12. According to some examples, one or both of the first electrode 14 and the second electrode 16 may also participate in the switching phenomenon of the memristor matrix (e.g., as a donor or acceptor of a dopant).

In various examples, the memristor matrix layer 12 of the memristor 10 may include any of a variety of oxides, nitrides and even sulfides that can be formed into a layer between a pair of electrodes. For example, a titanium oxide (e.g., $TiO_2$) may be used as the oxide layer in a memristor. Other oxides that may be employed include, but are not limited to, hafnium oxide, nickel oxide, nickel oxide doped with chromium, strontium titanate, chromium doped strontium titanate, tantalum oxide, niobium, and tungsten oxide, for example. Nitrides used as a nitride layer of a memristor include, but are not limited to, aluminum nitride and silicon nitride. In addition, other compounds including, but not limited to, antimony telluride, antimony germanium telluride or silver-doped amorphous silicon may be employed, for example.

In some examples, the memristor matrix layer 12 may include a crystalline oxide (e.g., an oxide layer). In other examples, the memristor matrix layer 12 may include a crystalline nitride (e.g., a nitride layer). In some of these examples, the crystalline oxide or nitride may be monocrystalline. In other examples, the memristor matrix layer 12 includes an amorphous oxide or nitride. In yet other examples, the memristor matrix layer 12 includes either a nanocrystalline oxide or nitride or a microcrystalline oxide or nitride. A nanocrystalline oxide or nitride is an oxide or nitride that includes a plurality of nanoscale crystallites while a microcrystalline oxide or nitride may include crystallites having sizes in the micron range, for example.

In some examples, the memristor matrix layer 12 may include a plurality of layers. A first layer of the plurality may be a stoichiometric oxide (e.g., $TiO_2$, $HfO_2$, etc.) while a second layer may be an oxygen depleted or oxygen deficient oxide layer (e.g., $TiO_{2-x}$, $HfO_{2-x}$, etc.) where '2-x' denotes an oxygen deficiency, and where x is greater than 0 and less than about 2). For example, the oxygen deficient $TiO_{2-x}$ may have values of x that are greater than about $10^{-5}$ and less than about $10^{-2}$. In another example, the oxygen deficient $TiO_{2-x}$ may have a value of x that ranges up to about 1.0. Similarly, a first layer of the plurality of layers of the memristor matrix layer 12 may be a stoichiometric nitride (e.g., AlN, $Si_3N_4$, etc.) while a second layer may be a nitrogen depleted or nitrogen deficient nitride layer (e.g., $AlN_{1-y}$, $Si_3N_{4-y}$, etc.), where y is a value that effectively represents nitrogen depletion in the respective stoichiometric nitride. In some examples, these oxygen deficient or nitrogen deficient layers may be referred to as 'suboxides' or 'subnitrides', respectively.

According to some examples, the change in the memristor matrix layer 12 produced by the programming signal may be understood in terms of oxygen (or nitrogen) migration within the memristor matrix layer 12. For example, a boundary between a layer of memristor matrix material 12b that is deficient in oxygen/nitrogen (e.g., the suboxide/subnitride layer) and another effectively stoichiometric memristor matrix material layer 12a (i.e., oxide/nitride that is not oxygen/nitride deficient) may move as a result of exposure to the programming signal. The movement of the boundary may result from oxygen or nitrogen migration under the influence of the programming signal, for example.

A final location of the movable boundary may establish the 'programmed' resistance of the memristor 10, according to some examples.

Alternatively, the change in the memristor matrix layer 12 may be understood in terms of a formation of current filaments, according to some examples. In either case, a conduction channel may be formed by the programming signal that results in a change in the programmed resistance of the memristor matrix layer 12 as measured between the first and second electrodes 14, 16. In general, the 'programmed resistance' is substantially an analog resistance (i.e., has a substantially continuous, analog resistance value between a maximum and minimum resistance value). In particular, the 'programmed resistance' may be programmed to exhibit substantially any resistance value between a maximum resistance and a minimum resistance of the memristor 10, by definition herein.

According to various examples, the first and second electrodes 14, 16 include a conductor. For example, the first electrode 14 and the second electrode 16 may include a conductive metal. The conductive metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. Other conductive metals and other conductive materials (e.g., a highly doped semiconductor, conductive oxides, conductive nitrides, etc.) may also be employed as the first electrode 14 and the second electrode 16, according to various examples. Moreover, the conductive material need not be the same in the first electrode 14 and the second electrode 16.

Additionally, one or both of the first electrode 14 and the second electrode 16 may include more than one layer. For example, a layer of Ti may be employed between a Pt-based electrode and a titanium oxide-based memristor matrix layer 12. The Ti layer may assist in providing an oxygen deficient layer (i.e., $TiO_{2-x}$) in the titanium oxide-based memristor matrix layer 12, for example. In still other examples, materials used in the electrodes 14, 16 may act as a diffusion barrier. For example, titanium nitride (TiN) may be employed as a diffusion barrier (e.g., to prevent material diffusion between the respective electrodes 14, 16 and the memristor matrix 12).

In some examples, a conductive material of one or both of the first electrode 14 and the second electrode 16 may include a metallic form or constituent of a metal oxide used as the memristor matrix layer 12. For example, a Ti metal may be employed in one or both of the electrodes 14, 16 when the memristor matrix layer 12 includes $TiO_2$. Similarly, one or both of the electrodes 14, 16 may include Ta when the memristor matrix layer 12 includes $Ta_2O_5$. In yet other examples, a refractory material such as tungsten may be used in one or both of the electrodes 14, 16.

According to various examples, the memristor 10 may provide 'storage' of the programmed resistance. In particular, the programmed resistance may be stored in a non-volatile manner by the memristor 10 by programming a particular resistance, according to some examples. For example, programming may establish a first programmed resistance of the memristor 10. After programming, the memristor 10 may be once again programmed (i.e., reprogrammed) to establish a second programmed resistance that is different from the first programmed resistance, for example. When not being programmed, the memristor 10 may substantially retain the programmed resistance (e.g., even in the absence of applied power).

The memristor 10 may be programmed by passing a current through the memristor 10, according to various examples. In particular, a particular programmed resistance may be programmed or set by application of an external signal referred to herein as a 'programming' signal. The programming signal may include one or both of a voltage and a current that is applied to the memristor 10. For example, the programming signal may be an applied voltage that induces the current through the memristor 10. By definition herein, a 'bipolar' memristor is a memristor in which a polarity of the programming signal (e.g., the applied voltage and, in turn, a direction of the current induced therein) dictates how the programmed resistance of the memristor is affected or changed by the programming signal. For example, a programming signal having a first polarity may increase the programmed resistance, while a programming signal having a second polarity may decrease the programmed resistance of the bipolar memristor. In other examples, the memristor may be 'unipolar' memristor in which a predetermined change in the programmed resistance occurs regardless of or substantially independent of a polarity of a programming signal, by definition herein.

According to various examples, the memristor 10 may be operated in a plurality of operational modes including, but not limited to, a single level cell (SLC) mode or a multi-level cell (MLC) mode. By definition herein, the MLC mode is generally characterized by, or has, more than two different resistance levels or 'resistive states' of the memristor 10, while the SLC mode is substantially restricted to just two memristor states, as is further described below. The memristor 10 may be configured to operate in either the SLC mode or the MLC by choosing characteristics of the programming signal, for example.

In particular, when configured to operate in the MLC mode, the memristor 10 may exhibit or be programmed by the programming signal to provide any of a plurality of predefined resistance values or levels. According to various examples, each of the predefined resistance levels corresponds to a 'resistive state' of the memristor 10 (i.e., also referred to as a 'memristor state'). The resistive states of the memristor 10 operated in the MLC mode may be changed in situ by programming the memristor 10 during operation. For example, the memristor 10 operated in the MLC mode may be programmed to exhibit a first resistance level of the plurality of predefined resistance levels corresponding to a first resistive state. Then, at a later time, the memristor 10 may be reprogrammed to exhibit a second resistance level of the plurality that corresponds to a second resistive state. At yet a later time, the memristor 10 may again be reprogrammed to either a third resistance level representing a third memristor state or back to the first resistance level of the first memristor state.

In general, the memristor 10 operated in the MLC mode may be switched from one resistive state to substantially any other resistive state of the predefined plurality of MLC resistive states by application of appropriate programming voltage, programming current, or equivalently 'programming signal.' Switching of the memristor 10 from a first resistive state to a second resistive state may also include or rely on information regarding the first resistive state, according to some examples. In some examples, the resistive states of the MLC mode may correspond to or be used to represent and store data in the memristor 10. Further, according to some examples, the resistive state (e.g., the programmed memristor state) of the memristor 10 operated in the MLC mode may be maintained by the memristor 10 without application of power to the memristor 10. Hence, the memristor 10 operated in the MLC mode may provide substantially non-volatile storage of data.

Figure 2A:
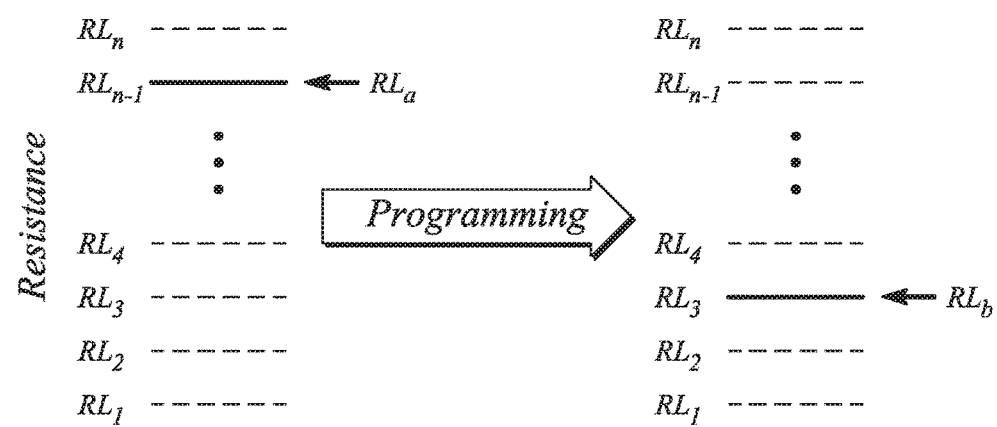
FIG. 2A illustrates a resistance diagram of a memristor configured to operate in a multi-level cell (MLC) mode, according to an example consistent with the principles described herein.

FIG. 2A illustrates a resistance diagram of a memristor (e.g., memristor 10 of FIG. 1) configured to operate in a multi-level cell (MLC) mode, according to an example consistent with the principles described herein. A left side of FIG. 2A illustrates a resistive state of the memristor prior to programming, while a right side illustrates the resistive state after programming, according to an example. In particular, FIG. 2A illustrates a plurality of possible resistance levels $RL_1$-$RL_n$ of the memristor (e.g., as measured across electrodes or terminals of the memristor 10 in FIG. 1). The possible resistance levels $RL_1$-$RL_n$ may correspond to a plurality of resistive states of the memristor operated in the MLC mode, for example. At the left side of the resistance diagram of FIG. 2A, an arrow points to an resistance level $R_a$ corresponding to a first resistive state prior to programming (i.e., $RL_a$=$RL_{n-1}$). After programming, the resistive state is changed to another resistance level $RL_b$, as illustrated by another arrow on the right side of the resistance diagram of FIG. 2A (i.e., $RL_b$=$RL_3$). The resistance level $RL_b$ may correspond to a second memristor state of the memristor 10, for example. In FIG. 2A, the pre-programming resistance level $RL_a$ and the post-programming resistance level $RL_b$ are illustrated using a heavy, solid line to distinguish these levels from other possible resistance levels $RL_1$-$RL_n$ illustrated with dashed lines.

On the other hand, the memristor (e.g., memristor 10 of FIG. 1), when operated in the SLC mode, exhibits or may be programmed to provide a selected one of two predefined resistance values or levels. As such, the memristor operated in the SLC mode has only two resistive states (i.e., two 'allowed' resistance levels). The two resistive states of the SLC mode may be used to represent and store binary data, according to some examples. For example, a first resistive state of the two states may represent a binary '0' while a second of the two resistive states may represent a binary '1'.

Figure 2B:
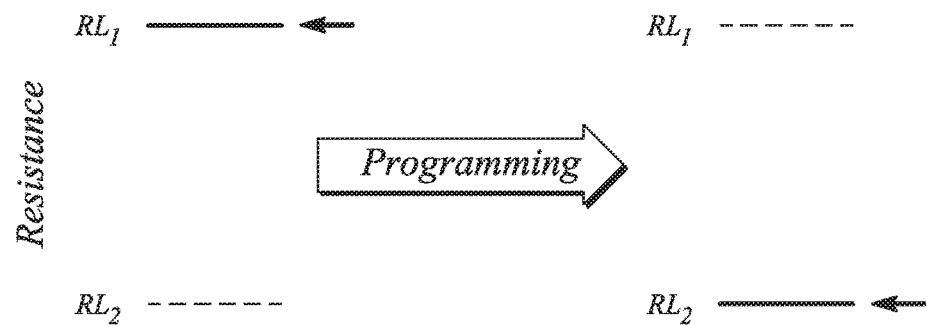
FIG. 2B illustrates a resistance diagram of a memristor configured to operate in a single level cell (SLC) mode, according to an example consistent with the principles described herein.

FIG. 2B illustrates a resistance diagram of a memristor (e.g., memristor 10 of FIG. 1) configured to operate in a single level cell (SLC) mode, according to an example consistent with the principles described herein. A left side of FIG. 2B illustrates a resistive state prior to programming, while a right side illustrates the resistive state after programming. In particular, FIG. 2B illustrates a pair of possible resistance levels $RL_1$, $RL_2$ of the memristor (e.g., as measured across electrodes or terminals of the memristor 10 in FIG. 1). The two possible resistance levels $RL_1$, $RL_2$ may correspond to two resistive states of the memristor operated in the SLC mode, for example. At the left side of the resistance diagram of FIG. 2B, an arrow points to a first resistance level $RL_1$ of the pair that corresponds to a first resistive state prior to programming. After programming, the resistive state is changed to a second resistance level $RL_2$ of the pair, as illustrated by another arrow on the right side of the resistance diagram of FIG. 2B. The resistance level $RL_2$ may correspond to a second resistive state of the memristor operated in SLC mode, for example. In FIG. 2B, the pre-programming resistance level $RL_1$ and the post-programming resistance level $RL_2$ are illustrated using a heavy, solid line to distinguish these levels from the respective other resistance levels $RL_1$, $RL_2$ illustrated using dashed lines on the pre-programming side and post-programming side.

Herein, the term 'switched' when used as an adjective herein means 'switchable', and in some examples, means that a switch capable of having alternative ON and OFF states is included. For example, a 'switched memristor' includes a memristor and a switch, by definition herein. More particular as is detailed below, the term 'switched memristor' includes a switch connected in parallel with the memristor, by definition herein. The term 'programmed' when used as an adjective herein means 'programmable,' by definition.

Herein, 'read margin' when applied to a memristor cell is defined as an effective separation between a pair of resistive states of the memristor cell that provides a predefined probability of correctly reading a programmed resistive state of the memristor cell. In particular, if the probability of reading the programmed resistive state correctly or reliably is 'high', then the memristor cell is said to have a 'high' read margin. On the other hand, if the probability of correctly or reliably reading the programmed resistive state is 'low,' then the memristor cell has a 'low' read margin, by definition herein.

Figure 3A:
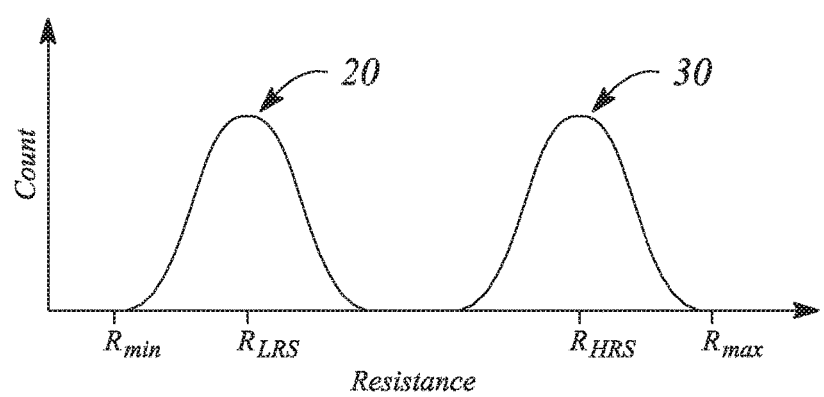
FIG. 3A illustrates a graph of resistive states of a memristor cell, according to an example consistent with the principles described herein.
Figure 3B:
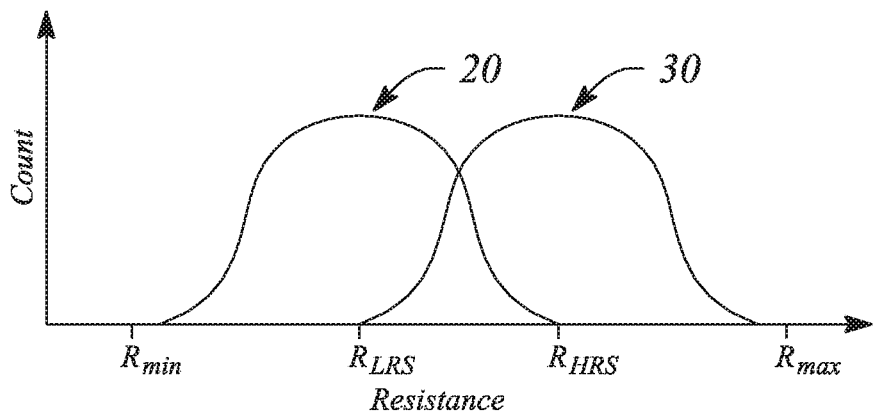
FIG. 3B illustrates a graph of resistive states of a memristor cell, according to another example consistent with the principles described herein.

FIG. 3A illustrates a graph of resistive states of a memristor cell, according to an example consistent with the principles described herein. FIG. 3B illustrates a graph of resistive states of a memristor cell, according to another example consistent with the principles described herein. In particular, FIG. 3A illustrates a graph of resistance vs. count for a memristor cell having a relatively high read margin and FIG. 3B illustrates a similar graph of resistance versus count for a memristor cell having a relatively low read margin, according to various examples.

In FIGS. 3A-3B, a first or 'low' resistive state of the memristor is denoted by '$R_{LRS}$,' while a second or 'high' resistive state is denoted by '$R_{HRS}$,' as illustrated. Also illustrated in FIGS. 3A-3B are a minimum resistance $R_{min}$ and a maximum resistance $R_{max}$ of the memristor. A resistance value of the low resistive state $R_{LRS}$ and a resistance value of the high resistance state $R_{HRS}$, respectively, are between the minimum resistance $R_{min}$ and maximum resistance $R_{max}$, as illustrated. Further, the 'count' refers to a number of times a particular programmed resistance is achieved for the memristor cell when programming the memristor cell according to either of the two resistive states $R_{LRS}$, $R_{HRS}$. As such, curves 20, 30 illustrated in FIGS. 3A-3B each represents, in terms of the 'count' dimension, a probability distribution of a programmed resistance of the memory cell when programmed according to the low resistive state $R_{LRS}$ (i.e., curve 20) and the high resistive state $R_{HRS}$ (i.e., curve 30), according to various examples. Further, FIG. 3B illustrates an example with substantially no functional read margin since it would likely be impossible to distinguish the state of memristor cell when its resistance lies in an overlap region between $R_{LRS}$ (curve 20) and $R_{HRS}$ (curve 30), for example.

As illustrated by the probability distributions in FIGS. 3A and 3B, actual programmed resistance values or levels of a memristor cell may vary from a mean resistance value of the respective resistive state (e.g., $R_{LRS}$, $R_{HRS}$) due to programming error as well as various 'noise-related' errors. The actual programmed resistance values may vary according to a probability distribution (e.g., a Gaussian distribution), as illustrated by the curves 20, 30, respectively. In examples where the separation between memristor cell resistive states is sufficiently large such that the probability distributions of the resistive states do not overlap to an appreciable extent (e.g., as illustrated by the curves 20, 30 in FIG. 3A), the read margin is considered high. In particular, the probability of misreading the programmed resistive state is low when the separation is sufficiently large. As a result, a high read margin may allow a programmed resistive state of the memristor cell to be read accurately and with high reliability.

On the other hand, if the separation is low, the probability distributions of the resistive states may have a relatively high degree of overlap (e.g., as illustrated by the curves 20, 30 in FIG. 3B). Hence, the read-reliability of the memristor cell may be low (i.e., it may be substantially impossible to reliably read the resistive state). In these situations the read margin is low or perhaps even substantially non-existent. In particular, when the probability distributions of the resistive states overlap, the memristor cell may not be able to store fully distinguishable resistive states, according to some examples. Low read-reliability may introduce errors in reading a programmed resistive state of the memristor cell, which in turn may introduce unacceptable errors when the memristor cell is used to store data, for example.

Herein, a 'non-transitory computer readable medium' is defined as substantially any data storage medium that provides non-transitory storage of information that may be read or otherwise utilized by a computer. For example, computer readable memory including, but not limited to, one or more of random access memory (RAM), read-only memory (ROM), programmable or erasable ROM and flash memory (e.g., a thumb drive) are all non-transitory computer readable medium, by definition herein. Other examples of a non-transitory computer readable medium include, but are not limited to, various types of magnetic disks and disk drives (e.g., a hard disk drive, a floppy disk drive, a floppy diskette, etc.) along with various optical discs and disc drives (e.g., CD, CD-R, CD-RW, DVD, etc.), by definition herein. In addition, network attached storage, so-called 'cloud' storage (e.g., remote data storage accessible via the Internet), and various other types of computer readable medium media used by modern computing systems may be a non-transitory computer readable medium, by definition herein.

Further, as used herein, the article 'a' is intended to have its ordinary meaning in the patent arts, namely 'one or more'. For example, 'a memristor' means one or more memristors and as such, 'the memristor' means 'the memristor(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, the term 'substantially' as used herein means a majority, or almost all, or all, or an amount within a range of about 51% to about 100%, for example. Moreover, examples herein are intended to be illustrative only and are presented for discussion purposes and not by way of limitation.

Figure 4:
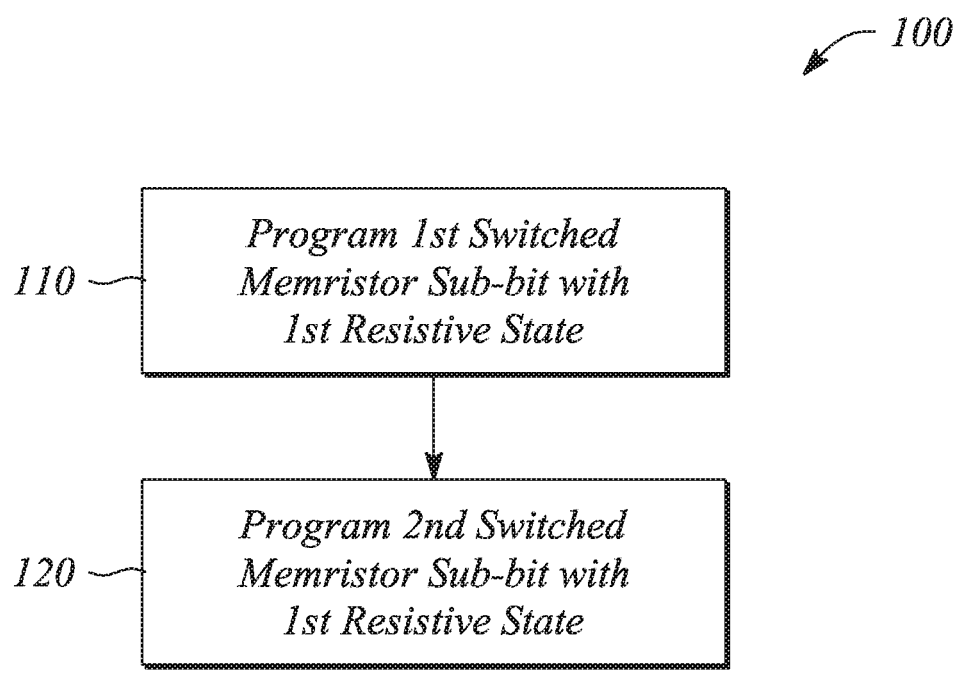
FIG. 4 illustrates a flow chart of a method of memristor cell read margin enhancement, according to an example consistent with the principles described herein.

According to some examples of the principles described herein, a method of enhancing a read margin of a memristor cell is provided. FIG. 4 illustrates a flow chart of a method 100 of memristor cell read margin enhancement, according to an example consistent with the principles described herein. According to some examples, the read margin enhancement may be or result in an increase in the read margin of the memristor cell. In particular, the memristor cell read margin enhancement may increase a read margin of the memristor cell relative to memristor sub-bits thereof, according to various examples.

According to some examples, the memristor cell may be a 'memory' cell of a resistance random access memory (RRAM). The RRAM may be arranged as a crossbar memory array with the memristor cells being located at cross-points within the crossbar memory array, for example.

The method 100 of memristor cell read margin enhancement may increase a read margin, and thus a 'read' reliability, of the RRAM, according to some examples.

According to various examples, the memristor cell includes a plurality of switched memristor sub-bits. In particular, the plurality may include N switched memristor sub-bits, where N is defined as an integer greater than one. For example, N may equal two (2), or three (3), or four (4), five (5), and so on. In another example, N may equal eight (8) or sixteen (16) in yet another example. By definition herein, a switched memristor sub-bit of the memristor cell includes a switch connected in parallel with a memristor. For example, a memristor cell with N equal to 8 switched memristor sub-bits includes 8 switches and 8 memristors, each of the 8 switches being connected in parallel with a different one of the 8 memristors. In addition, see the discussion below regarding memristor cells with respect to FIG. 5.

According to various examples, the N switched memristor sub-bits are connected in series within the memristor cell. A resistance or 'resistive state' of the memristor cell includes or is provided by resistances or resistive states of the N switched memristor sub-bits, according to various examples. For example, a resistive state of the memristor cell may equal a sum of the resistive states of activated ones of the N switched memristor sub-bits.

Referring to FIG. 4, the method 100 of memristor cell read margin enhancement includes programming 110 a first switched memristor sub-bit of the series-connected N switched memristor sub-bits of a memristor cell. In particular, the first switched memristor sub-bit is programmed 110 with a first resistive state (e.g., a high resistance state or a low resistance state), according to various examples. The method 100 of memristor cell read margin enhancement further includes programming 120 a second switched memristor sub-bit of the memristor cell with the first resistive state. In particular, the resistance states of both the first and second memristor sub-bits of the memristor cell are substantially equal to one another after programming 110, 120, according to various examples. Moreover, the first and second memristor sub-bits are programmed 110, 120 separately and independently to the first resistive state, according to various examples.

As such, a combination of programming 110 the first switched memristor sub-bit and programming 120 the second switched memristor sub-bit spreads a first resistive state of the memristor cell across the first and second switched memristor sub-bits, e.g., as the first resistive state programmed 110, 120 into the first and second switched memristor sub-bits, respectively. Furthermore, programming 110, 120 results in the first and second memristor sub-bits having or being programmed with the same resistive state. Also, while described in terms of a first switched memristor sub-bit and a second switched memristor sub-bit, programming may involve substantially any number of switched memristor sub-bits (e.g., all N) of the memory cell such that all programmed switched memristor sub-bits have the same resistive state once programmed, according to various examples.

Figure 5:
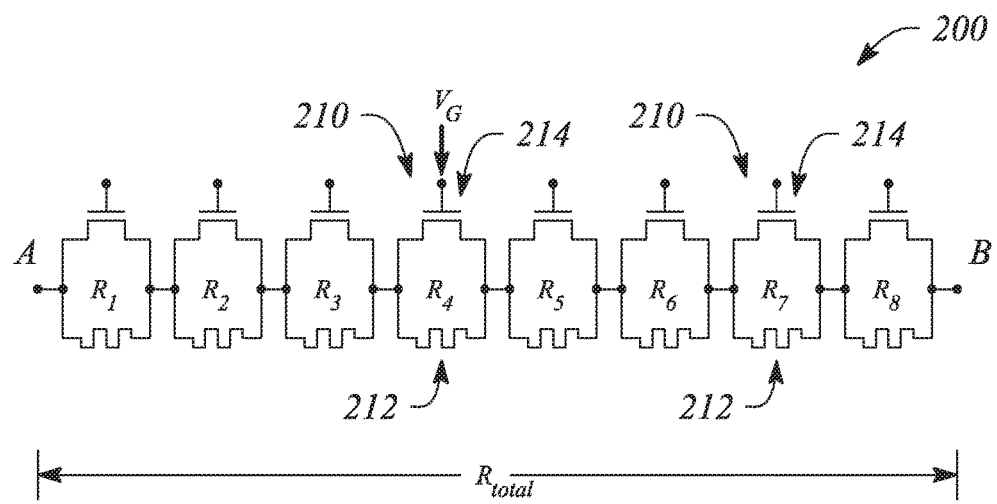
FIG. 5 illustrates a schematic diagram of a memristor cell, according to an example consistent with the principles described herein.

FIG. 5 illustrates a schematic diagram of a memristor cell 200, according to an example consistent with the principles described herein. In particular, FIG. 5 illustrates the memristor cell 200 including a plurality of switched memristor sub-bits 210 connected in series with one another. The series-connected switched memristor sub-bits 210 may be referred to as a 'NAND string' or a 'NAND-structured series' of switched memristors 210, for example. The 'NAND' terminology is due to a similarity with a configuration of switches employed in a 'not-and' or NAND gate. According to various examples, the memristor cell 200 of FIG. 5 may represent the memristor cell (i.e., that includes the series-connected memristor sub-bits) used in the method 100 of memristor cell read margin enhancement, described above.

According to various examples, a switched memristor sub-bit 210 of the memristor cell 200 includes a memristor 212 connected in parallel with a switch 214. The memristor 212 of the switched memristor sub-bit 210 has a programmable resistance configured to provide the resistive state of the switched memristor sub-bit 210, according to various examples. In particular, a resistance of the memristor 212 may be programmed to a predefined resistance value between a maximum resistance and a minimum resistance of the memristor 212. The predefined resistance represents the resistive state of the memristor 212, and in turn, the resistive state of the switched memristor sub-bit 210 that includes the memristor 212, by definition herein.

According to various examples, the memristor 212 may be programmed by the application of a programming signal to the memristor 212. The programming signal may include one or both of a programming voltage applied to and a programming current flowing through the memristor 212, for example. Further, the programmed resistance or resistive state is substantially maintained by the memristor 212 after being programmed, according to various examples. In particular, the memristor 212 may 'store' the programmed resistance in a substantially non-volatile manner in the absence of an applied power source (e.g., a voltage source, current source, etc.). Further, the programmed resistance is substantially maintained until the memristor 212 is reprogrammed by the application of another programming signal, according to various examples.

The switch 214, which is connected in parallel with the memristor 212, is configured to provide selection of the memristor 212 of the switched memristor sub-bit 210. In particular, when the switch 214 is 'ON' or closed, the memristor 212 of the switched memristor sub-bit 210 is substantially bypassed or 'removed from' the plurality of switched memristor sub-bits 210. For example, an electric current flowing through the plurality of switched memristor sub-bits 210 connected in series substantially flows through the closed switch 214 of the switched memristor sub-bit 210 instead of through the bypassed memristor 212. As a result, the programmed resistance of the bypassed memristor 212 generally does not contribute in a substantial manner to a total resistance of the memristor cell 200. The switched memristor sub-bit 210 having the bypassed memristor 212 (i.e., with the switch 214 closed or 'ON') is 'switched OFF,' by definition herein. On the other hand, when the switch 214 is 'OFF' or open, the memristor 212 connected in parallel with the switch 214 of the switched memristor sub-bit 210 is not bypassed. As a result, the programmed resistance of the memristor 212 contributes to the total resistance of the memristor cell 200. Herein, the switched memristor sub-bit 210 in which the memristor 212 is not bypassed (i.e., having the switch 214 open or 'OFF') is 'switched ON,' by definition herein.

In some examples, the switch 214 may be or include a solid-state switch such as, but not limited to, a field effect transistor (FET). For example, the switch 214 may include a FET with a source of the FET connected to a first terminal of the memristor 212 and a drain of the FET connected to a second terminal of the memristor 212. The FET may be an n-channel or a p-channel FET (e.g., an n-channel or a p-channel metal-oxide FET or MOSFET), according to some examples. The switch 214 that is or that includes a FET (e.g., an enhancement mode MOSFET) may be turned ON and OFF by appropriate application of a gate voltage $V_G$ to a gate of the FET. For example, a positive gate voltage $V_G$ may turn ON an n-channel FET when a gate-to-source voltage $V_{GS}$ exceeds a threshold voltage $V_T$ of the n-channel FET (e.g., the n-channel FET is ON for $V_G$ such that $V_{GS}>V_T$). Removal or reduction of the positive gate voltage $V_G$ such that the gate-to-source voltage $V_{GS}$ is less than the threshold voltage $V_T$ may cause the n-channel FET to turn OFF (e.g., the n-channel FET is OFF for $V_G$ such that $V_{GS}<V_T$). In another example using a different type of FET (e.g., a depletion mode MOSFET), application of the gate voltage $V_G$ may turn OFF the FET while removal of the gate voltage $V_G$ may turn ON the FET. In other examples, the switch 214 may be implemented using another type of transistor switch (e.g., bipolar transistor) or even a non transistor-based switch (e.g., microelectromechanical system (MEMS) switch), for example.

The memristor cell 200 illustrated in FIG. 5 includes eight individual memristors 212 and eight parallel-connected switches 214 to make up eight switched memristor sub-bits 210 (i.e., N=8), by way of example and not limitation. The eight switches 214 of the eight switched memristor sub-bits 210 in FIG. 5 are FET switches, as illustrated. Further as illustrated, the eight individual memristors 212 may be individually programmed with separate or distinct programmed resistance values $R_1, R_2, \ldots, R_8$, respectively, wherein the separate resistance values may be different, or one or more may have the same value, according to various examples. Other than being between a maximum resistance value $R_{max}$ and a minimum resistance value $R_{min}$ of a respective individual memristor 212, each of the programmed resistance values R, may be substantially any, arbitrarily chosen, resistive state of the individual memristors 212. A resistance (e.g., a total resistance $R_{total}$) of the memristor cell 200 may be measured from a first terminal A to a second terminal B illustrated in FIG. 5, for example. The measured resistance may represent the resistive state of the memristor cell 200 and is, in general, a summation of the resistances or resistive states of activated switched memristor sub-bits 210 (i.e., switched memristor sub-bits that are turned ON) of the memristor cell 200.

Although not explicitly illustrated, it is possible to select a single memristor sub-bit 210 of the plurality of switched memristor sub-bits 210 by turning ON a selected switched memristor sub-bit 210 of the plurality and turning OFF (e.g., bypassing) all of the other switched memristor sub-bits 210. With only the selected switched memristor sub-bit 210 turned ON, all of the non-selected switched memristor sub-bits 210 are bypassed and thus do not contribute to a total resistance $R_{total}$ of the memristor cell 200. Selecting a single switched memristor sub-bit 210 may allow for selectively programming a resistive state of the memristor 212, for example. Similarly, a set of switched memristor sub-bits 210 may be selected by turning ON only those being selected. For example, a set that is less than or equal to N switched memristor sub-bits 210 may be turned ON or 'activated' to employ those activated switched memristor sub-bits 210 in the memory cell 210. Once activated, the memristor cell 210 will exhibit a sum of the programmed resistive states of the activated switched memristor sub-bits 210, for example.

Figure 6A:
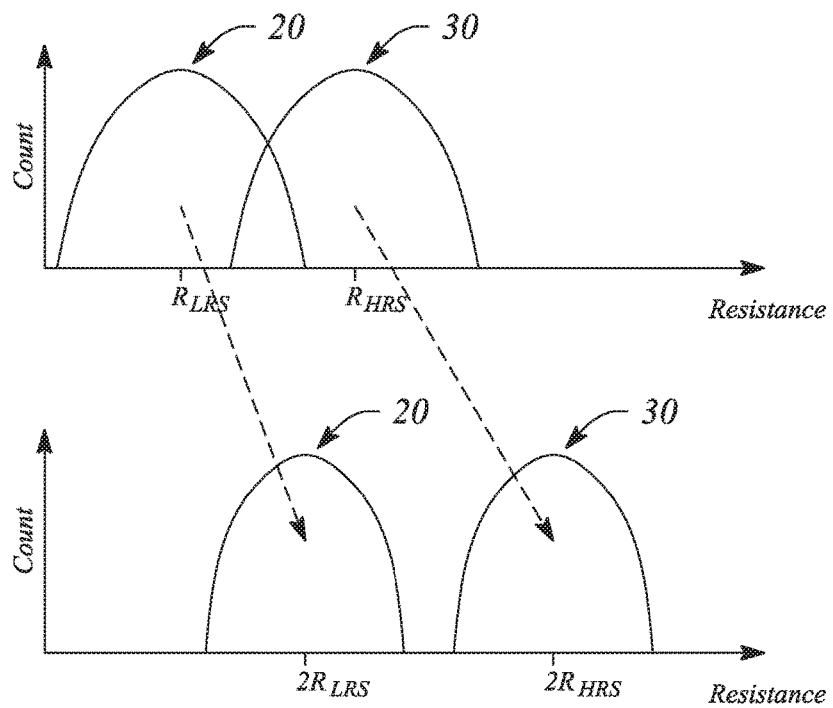
FIG. 6A illustrates graphs of resistive states of a memristor cell, according to an example consistent with the principles described herein.

FIG. 6A illustrates graphs of resistive states of a memristor cell, according to an example consistent with the principles described herein. In particular, a graph in an upper portion of FIG. 6A includes curves 20, 30 that represent probability distributions associated with two resistive states $R_{LRS}$, $R_{HRS}$ of the memristor cell. In the upper portion graph of FIG. 6A, the probability distribution curves 20, 30 overlap. As such, the memristor cell associated with the graph in the upper portion of FIG. 6A has a low or substantially non-existent read margin. In contrast, in a lower portion of FIG. 6A, a graph illustrates curves 20, 30 representing probability distributions associated with two resistive states $2R_{LRS}$, $2R_{HRS}$ of a memristor cell where the curves 20, 30 do not overlap and also include a degree of separation therebetween, for example. The memristor cell associated with the graph in the lower portion of FIG. 6A has an increased read margin relative to the read margin of the memristor cell associated with the upper portion of FIG. 6A, by definition herein, and as indicated by dashed-line arrows between the graphs of the upper and lower portions of FIG. 6A.

In FIG. 6A, the resistance levels of the two resistive states '$2R_{LRS}$, $2R_{HRS}$' for the memristor cell in the lower portion graph are two times (2×) the resistance levels of the resistive states '$R_{LRS}$, $R_{HRS}$' for the memristor cell of the upper portion graph of FIG. 6A, by way of example and not limitation. The increase in resistance levels by two times, according to this example, may be achieved by using a memristor cell with a pair of switched memristor sub-bits as opposed to a memristor cell with a single memristor sub-bit. In particular, the memristor cells represented by their resistance levels in the upper and lower portion graphs may differ from each other by the number or quantity of switched memristor sub-bits respectively programmed in accordance with the method 100 of read margin enhancement. The method 100 of read margin enhancement will increase the read margin of a memristor cell by programming 110, 120 more of the switched memristor sub-bits (e.g., up to N of a total of N) in the memory cell with a particular resistive state. The dashed-line arrows between the graphs of the upper and lower portions of FIG. 6A are intended to illustrate that as more switched memristor sub-bits are programmed 110, 120 (e.g., '$R_{LRS}$, $R_{HRS}$'->'$2R_{LRS}$, $2R_{HRS}$') in accordance with the method 100, the overlap between the probability distribution curves of the low and high resistive states diminishes and a separation of an increasing degree may be achieved between the probability distribution curves 20, 30 thereof.

Figure 6B:
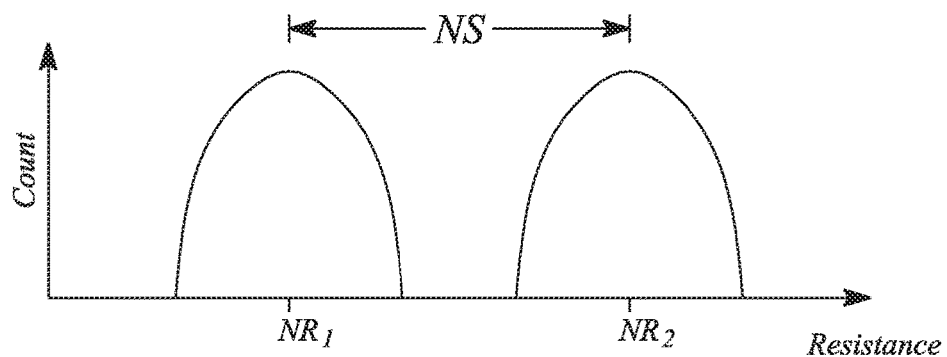
FIG. 6B illustrates a graph of resistive states of a memristor cell, according to another example consistent with the principles described herein.

FIG. 6B illustrates a graph of resistive states of a memristor cell, according to another example consistent with the principles described herein. In particular, FIG. 6B illustrates resistive states $NR_1$ and $NR_2$ where 'N' denotes the number of switched memristor sub-bits connected in series within the memristor cell and programmed with the same resistive state. As the number 'N' increases, so does the read margin of the memristor cell, according to various examples of the principles described herein. For example, the separation NS between the resistive states $NR_1$ and $NR_2$ may increase proportionally to N relative to a separation S for a single memristor sub-bit, as illustrated. Further, a probability distribution of the resistive states $NR_1$ and $NR_2$ may also decrease with increasing N, according to some examples (not illustrated), such as when the individual resistive values of the N memristor sub-bits are not substantially correlated (e.g., other than having the same resistive state distribution).

Referring back to FIG. 4, according to some examples of the method 100 of memristor cell read margin enhancement, the memristor cell may be configured to exhibit single level cell (SLC) operation (e.g., the memristor cell may be an SLC memristor cell or be operated in an SLC mode). According to SLC operation, the first resistive state is a predetermined one of a pair of SLC resistive states of the switched memristor sub-bits. Further, a resistive state of the SLC-operated memristor cell is represented by a combination of the resistive states of the switched memristor sub-bits configured to exhibit SLC operation, according to various examples.

In particular, the memristor cell may include switched memristor sub-bits configured to operate as SLC sub-bits capable of exhibiting either a first SLC resistive state or a second SLC resistive state of a pair of SLC resistive states (e.g., a high resistive state and a low resistive state). When programming 110, 120 the first and second switched memristor sub-bits according to the method 100 of memristor cell read margin enhancement, one of the first and second SLC resistive states is selected and both the first and second switched memristor sub-bits operating as SLC sub-bits are programmed 110, 120 with the selected SLC resistive state. The selected SLC resistive state (e.g., the first resistive state) of the switched memristor sub-bits then provides the SLC resistive state exhibited by the memristor cell. In particular, the resistive state of the memristor cell is a sum of the programmed one of the first and second SLC resistive states of the switched memristor sub-bits (i.e., the SLC sub-bits), according to various examples.

In other examples, the memristor cell is configured to exhibit multi-level cell (MLC) operation (e.g., the memristor cell may be an MLC memristor cell or be operated in an MLC mode). According to MLC operation, the first resistive state is a predetermined one of a plurality of MLC resistive states of the switched memristor sub-bits. Further, a resistive state of the MLC-operated memristor cell is represented by a combination of the MLC resistive states of the switched memristor sub-bits of the memristor cell configured to exhibit MLC operation, according to various examples.

In particular, the memristor cell may include switched memristor sub-bits configured to operate as MLC sub-bits capable of exhibiting any of a plurality of MLC resistive states. When programming 110, 120 the first and second switched memristors according to the method 100 of memristor cell read margin enhancement, one of the plurality of MLC resistive states is selected as the first resistive state and both the first and second switched memristors operating as MLC sub-bits are programmed 110, 120 with the selected MLC resistive state. The selected MLC resistive state (i.e., the first resistive state) of the switched memristor sub-bits then provides the MLC resistive state exhibited by the memristor cell. In particular, the resistive state of the memristor cell is a sum of the programmed 110, 120 selected MLC resistive states of the switched memristor sub-bits (i.e., the MLC sub-bits), according to various examples.

According to some examples (not illustrated), the method 100 of memristor cell read margin enhancement further includes programming the first switched memristor sub-bit of the memristor cell with a second resistive state and programming the second switched memristor sub-bit of the memristor cell with the second resistive state. The second resistive state is a different resistive state from the first resistive state and therefore represents changing data stored by the memristor cell, for example.

According to some examples (not illustrated), the method 100 of memristor cell read margin enhancement further includes programming a third switched memristor sub-bit of the memristor cell with the first resistive state. The third switched memristor sub-bit may be connected in series with the first and second switched memristor sub-bits. Programming the third switched memristor sub-bit with the first resistive is configured to further increase the read margin of the memristor cell, according to various examples.

Figure 7:
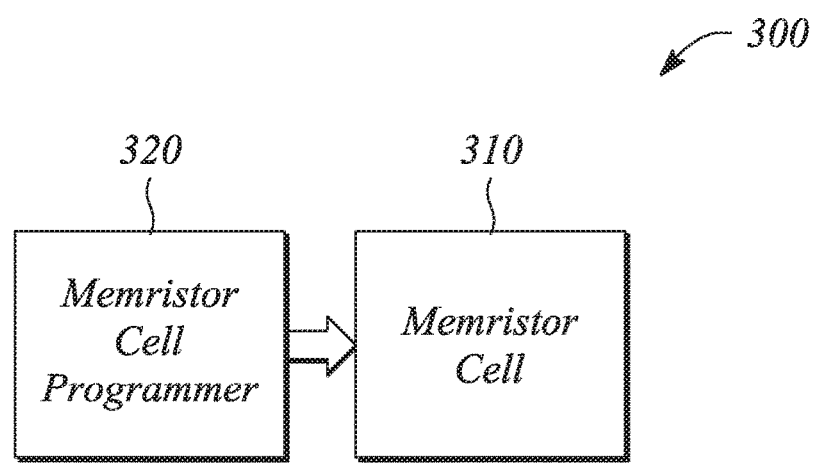
FIG. 7 illustrates a block diagram of a memristor cell read margin enhancement system, according to an example consistent with the principles described herein.

In some examples of the principles described herein, a memristor cell read margin enhancement system is provided. FIG. 7 illustrates a block diagram of a memristor cell read margin enhancement system 300, according to an example consistent with the principles described herein. The memristor cell read margin enhancement system 300 illustrated in FIG. 7 includes a memristor cell 310. The memristor cell 310 includes a plurality of switched memristor sub-bits connected in series with one another. According to various examples, the memristor cell 310 may be substantially similar to the memristor cell described above with respect to the method 100 of memristor cell read margin enhancement as well as with respect to the memristor cell 200 illustrated and described with respect to FIG. 5.

In particular, in various examples, a switched memristor sub-bit of the memristor cell 310 includes a switch connected in parallel with a memristor. For example, each of a first switched memristor sub-bit and a second switched memristor sub-bit of the memristor cell 310 may include a switch connected in parallel with a memristor. In some examples, the switch is a field effect transistor (FET). A source of the FET may be connected to a first terminal of the memristor and a drain of the FET may be connected to a second terminal of the memristor, for example. The FET may serve as a switch to provide switch selection of (i.e., to turn ON or bypass) the switched memristor sub-bit, according to various examples. In other examples, the switch of the switched memristor sub-bit may be another type of switch other than the FET. The other types of switches may include, but is not limited to, another type of transistor switch or a non transistor-based switch (e.g., microelectromechanical system or 'MEMS' switch), for example.

Further according to various examples, the switched memristor sub-bit may be configured to operate in one or both of a single level cell (SLC) mode and a multi-level cell (MLC) mode. In particular, the switched memristor sub-bit of the memristor cell 310 (e.g., a first switched memristor sub-bit and a second switched memristor sub-bit) may be an SLC switched memristor sub-bit. In another example, the switched memristor sub-bits of the memristor cell 310 (e.g., a first and a second switched memristor sub-bit) may be an MLC switched memristor sub-bit.

As illustrated in FIG. 7, the memristor cell read margin enhancement system 300 further includes a memristor cell programmer 320 configured to store data in the memristor cell 310. According to various examples, the memristor cell programmer 320 has a read margin enhancement mode to store the data. The read margin enhancement mode is configured to store data, which includes setting both a first switched memristor sub-bit and a second switched memristor sub-bit of the switched memristor sub-bit plurality to a first resistive state. In some examples, the read margin enhancement mode may be configured to set other switched memristor sub-bits of the switched memristor plurality (e.g., a third, a fourth and so on up to an N-th switched memristor sub-bit) to the first resistive state. The read margin enhancement mode is configured to increase a read margin of the memristor cell 310 relative to a read margin of either of the first switched memristor sub-bit or the second switched memristor sub-bit, according to various examples. According to some examples, setting both the first and second switched memristor sub-bits to the first resistive state is substantially similar to the method 100 of memristor cell read margin enhancement described above.

In some examples, the read margin enhancement mode of the memristor cell programmer 320 is configured to further store data, which includes setting a third memristor sub-bit of the memristor cell 310 to the first resistive state. Setting the third memristor sub-bit to the resistive state may further increase the read margin of the memristor cell 310, according to some examples. In some examples, the memristor cell programmer 320 further has a normal mode. The normal mode is configured to store data in the memristor cell 310 and includes setting resistive states of the first switched memristor sub-bit and the second switched memristor independent of one another. The normal mode and the read margin enhancement mode may be selectable operational modes of the memristor cell programmer 320, according to various examples.

Figure 8:
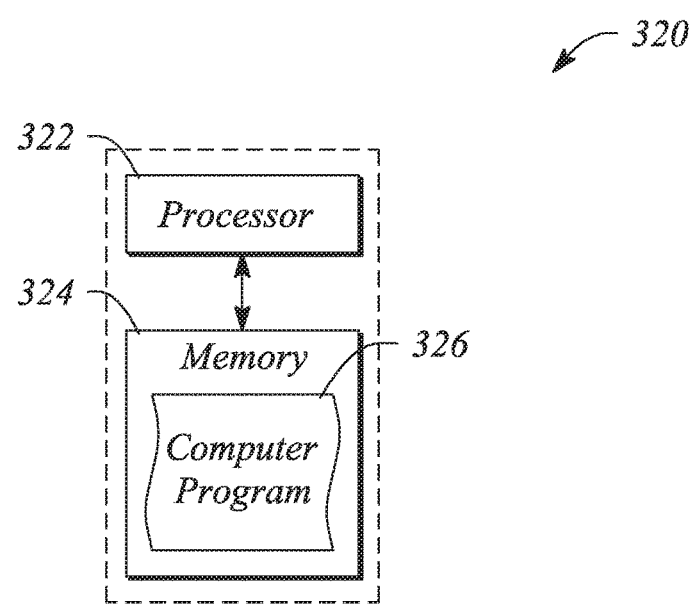
FIG. 8 illustrates a block diagram of a memristor cell programmer, according to an example consistent with the principles described herein.

FIG. 8 illustrates a block diagram of a memristor cell programmer 320, according to an example consistent with the principles described herein. As illustrated in FIG. 8, the memristor cell programmer 320 includes a processor 322, a memory 324 and a computer program 326. The computer program 326 is stored in the memory 324 and includes instructions that, when executed by the processor 322, implement the memristor cell read margin enhancement mode to store data, according to various examples.

For example, the processor 322 may be a processor of a general-purpose computer (e.g., a microprocessor) and the memory 324 may be non-transitory memory (e.g., random access memory, a computer readable medium, etc.) of the general-purpose computer. In another example, a specialized processor such as, but not limited to, a graphics processor, an applications specific integrated circuit (ASIC), a field programmable gate array (FPGA), a parallel processor, a virtual processor (e.g., a cloud based), etc., may be employed as the processor 322. According to various examples, the memory 324 may include, but is not limited to, random access memory (RAM), static RAM (SRAM), and dynamic RAM (DRAM), read-only memory (ROM), erasable programmable ROM (EPROM), electrically erasable programmable ROM (EEPROM), flash memory, a magnetic or an optical disk drive, e.g., a hard disk drive (HDD), a floppy disk drive (FDD), a compact disc read-only memory (CD-ROM), a digital versatile disk (DVD), a thumb drive, and various forms of network attached storage (e.g., cloud-based storage).

In some examples consistent with the principles described herein, a non-transitory computer readable medium is provided that is configured to implement memristor cell read margin enhancement. For example, the non-transitory computer readable medium may include instructions that, when executed by a processor, implement memristor cell read margin enhancement that is substantially similar to method 100 of memristor cell read margin enhancement. In particular, in some examples, the instructions may implement programming a switched memristor sub-bit of a memristor cell with a first resistive state. The memristor cell may include a plurality of switched memristor sub-bits connected in series with one another, for example. The instructions may further implement programming another switched memristor sub-bit of the memristor cell with the first resistive state. A read margin of the memristor cell may be increased relative to a read margin of either of the switched memristor sub-bits of the memristor cell, for example. According to various examples, the switched memristor sub-bits of the plurality include memristors configured to exhibit one of SLC operation and MLC operation. Further, the resistive state respectively may represent a predetermined one of a pair of SLC resistive states or one of a plurality of MLC states, according to various examples.

Thus, there have been described examples of a method of memristor cell read margin enhancement, a memristor cell read margin enhancement system, and a non-transitory computer readable medium to implement memristor cell read margin enhancement that employ switched memristor sub-bits of a memristor cell programmed with a resistive state. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of memristor cell read margin enhancement, the method comprising:
    programming a first switched memristor sub-bit of a memristor cell with a first resistive state; and
    programming a second switched memristor sub-bit of the memristor cell with the first resistive state, the second switched memristor sub-bit being connected in series with the first switched memristor sub-bit,
    wherein a read margin of the memristor cell is increased relative to a read margin of either of the first switched memristor sub-bit or the second switched memristor sub-bit, and
    wherein the first and second switched memristor sub-bits of the memristor cell are programmed with the first resistive state to increase the read margin of the memristor cell in a read margin enhancement mode of a cell programmer performing the programming, and the method further comprises:
        in a normal mode of the cell programmer, storing resistive states of the first and second switched memristor sub-bits independent of one another when storing data in the memristor cell,
        wherein the read margin enhancement mode and the normal mode are selectable operational modes of the cell programmer.

2. The method of memristor cell read margin enhancement of claim 1, wherein the first and second switched memristor sub-bits each comprises a switch connected in parallel with a memristor, the switch being a field effect transistor (FET) with a source of the FET connected to a first terminal of the memristor and a drain of the FET connected to a second terminal of the memristor.

3. The method of memristor cell read margin enhancement of claim 1, wherein the memristor cell is to exhibit single level cell (SLC) operation and the first resistive state is a predetermined one of a pair of SLC resistive states of the switched memristor sub-bits.

4. The method of memristor cell read margin enhancement of claim 1, wherein the memristor cell is to exhibit multi-level cell (MLC) operation and the first resistive state is a predetermined one of a plurality of MLC resistive states of the switched memristor sub-bits.

5. The method of memristor cell read margin enhancement of claim 1, further comprising:
    programming the first switched memristor sub-bit of the memristor cell with a second resistive state; and
    programming the second switched memristor sub-bit of the memristor cell with the second resistive state.

6. The method of memristor cell read margin enhancement of claim 1, further comprising:
    programming a third switched memristor sub-bit of the memristor cell with the first resistive state, the third switched memristor sub-bit being connected in series with the first and second switched memristor sub-bits, wherein programming the third switched memristor sub-bit with the first resistive state further increases the read margin of the memristor cell.

7. A non-transitory computer readable medium including instructions that, when executed by a processor, implement the method of memristor cell read margin enhancement of claim 1.

8. The method of memristor cell read margin enhancement of claim 1, wherein programming each of the first and second switched memristor sub-bits of the memristor cell increases the read margin of the memristor cell by increasing a difference of resistances of the memristor cell corresponding to different logic states storable by the memristor cell.

9. A memristor cell read margin enhancement system comprising:
a memristor cell comprising a plurality of switched memristor sub-bits connected in series;
a memristor cell programmer having a read margin enhancement mode to store data in the memristor cell, the read margin enhancement mode comprising setting both a first switched memristor sub-bit and a second switched memristor sub-bit of the plurality to a first resistive state,
wherein the read margin enhancement mode is to increase a read margin of the memristor cell relative to a read margin of either of the first memristor sub-bit and the second switched memristor sub-bit; and
wherein the memristor cell programmer further has a normal mode, the normal mode to store data in the memristor cell comprising setting resistive states of the first switched memristor sub-bit and the second switched memristor sub-bit independent of one another, the normal mode and the read margin enhancement mode being selectable operational modes of the memristor cell programmer.

10. The memristor cell read margin enhancement system of claim 9, wherein the first and second switched memristor sub-bits each comprises a switch connected in parallel with a memristor, the switch being a field effect transistor (FET) with a source of the FET connected to a first terminal of the memristor and a drain of the FET connected to a second terminal of the memristor.

11. The memristor cell read margin enhancement system of claim 9, wherein the first and second switched memristor sub-bits of the plurality are single level cell (SLC) switched memristor sub-bits, the first resistive state being a predetermined one of a pair of SLC resistive states of the SLC switched memristor sub-bits.

12. The memristor cell read margin enhancement system of claim 9, wherein the read margin enhancement mode further comprises setting a third memristor sub-bit of the memristor cell to the first resistive state, wherein setting the third memristor sub-bit to the first resistive state is to further increase the read margin of the memristor cell.

13. The memristor cell read margin enhancement system of claim 9, wherein the memristor cell programmer comprises:
a processor;
a memory; and
a computer program stored in the memory, the computer program including instructions that, when executed by the processor, implement the read margin enhancement mode to store data in the memristor cell.

14. The memristor cell read margin enhancement system of claim 9, wherein the read margin enhance mode increases the read margin of the memristor cell by increasing a difference of resistances of the memristor cell corresponding to different logic states storable by the memristor cell.

15. A non-transitory computer readable medium including instructions that, when executed by a processor, implement memristor cell read margin enhancement comprising:
programming a switched memristor sub-bit of a memristor cell with a resistive state, the memristor cell comprising a plurality of switched memristor sub-bits connected in series; and
programming another switched memristor sub-bit of the memristor cell with the resistive state,
wherein a read margin of the memristor cell is increased relative to a read margin of either of the switched memristor sub-bits of the memristor cell; and
wherein the switched memristor sub-bits of the memristor cell are programmed with the resistive state to increase the read margin of the memristor cell in a read margin enhancement mode of a cell programmer performing the programming, and the memristor cell read margin enhancement further comprises:
in a normal mode of the cell programmer, storing resistive states of the switched memristor sub-bits independent of one another when storing data in the memristor cell,
wherein the read margin enhancement mode and the normal mode are selectable operational modes of the cell programmer.

16. A non-transitory computer readable medium of claim 15, wherein the switched memristor sub-bits of the plurality comprise memristors to exhibit one of single level cell (SLC) operation and multi-level cell (MLC) operation, the resistive state respectively representing a predetermined one of a pair of SLC resistive states or predetermined one of a plurality of MLC states.

17. The non-transitory computer readable medium of claim 15, wherein programming each of the switched memristor sub-bits of the memristor cell increases the read margin of the memristor cell by increasing a difference of resistances of the memristor cell corresponding to different logic states storable by the memristor cell.

* * * * *